United States Patent [19]

Topich

[11] 4,419,812

[45] Dec. 13, 1983

[54] METHOD OF FABRICATING AN INTEGRATED CIRCUIT VOLTAGE MULTIPLIER CONTAINING A PARALLEL PLATE CAPACITOR

[75] Inventor: James A. Topich, Centerville, Ohio

[73] Assignee: NCR Corporation, Dayton, Ohio

[21] Appl. No.: 410,674

[22] Filed: Aug. 23, 1982

[51] Int. Cl.³ ............................................. H01L 21/98
[52] U.S. Cl. ................................... 29/571; 29/577 C; 29/578; 29/25.42; 148/187; 148/188; 357/51; 357/59
[58] Field of Search ...................... 357/51, 59; 148/1.5, 148/187, 188; 29/571, 577 C, 578, 591, 25.42

[56] References Cited

U.S. PATENT DOCUMENTS

| | | | |
|---|---|---|---|
| 3,860,836 | 1/1975 | Pederson | 307/303 |
| 3,864,817 | 2/1975 | Lapham, Jr. et al. | 29/577 |
| 4,115,795 | 9/1978 | Masuoka et al. | 357/24 |
| 4,240,092 | 12/1980 | Kuo | 357/41 |
| 4,249,194 | 2/1981 | Rogers | 357/51 |

OTHER PUBLICATIONS

"On-Chip High-Voltage Generation in MNOS Integrated Circuits Using Improved Voltage Multiplier Technique", by J. F. Dickson, IEEE Journal of Solid State Circuits, vol. SC 11, No. 3, Jun. 1976, pp. 374–378.

Primary Examiner—G. Ozaki
Assistant Examiner—Alan E. Schiavelli
Attorney, Agent, or Firm—J. T. Cavender; Casimer K. Salys; T. Rao Coca

[57] ABSTRACT

Disclosed is a process which is fully compatible with normal two layer polysilicon SNOS process and provides polysilicon parallel plate capacitors and silicon gate non-memory MOS transistors (diodes) for constructing therefrom an on-chip, dual polarity high voltage multiplier. From the polysilicon I layer deposited over a gate oxide, the polysilicon I resistor, the non-memory device gate and the capacitor lower plate are formed. Then, the resistor, non-memory device gate and active region and the periphery of the capacitor lower plate are covered with an isolation oxide. Next, a dielectric, e.g., oxide-nitride, and polysilicon II layers are formed over the structure. Polysilicon II is patterned into interconnect, gate for SNOS memory device and capacitor upper plate, the latter having a plurality of holes therein. The dielectric is formed into SNOS device gate insulator and the capacitor insulator, the latter having holes in registration with the holes in the capacitor upper plate. Finally, by thermal diffusion of active impurities, all gates, interconnect and both capacitor plates are doped and all sources and drains for memory and non-memory devices formed.

14 Claims, 12 Drawing Figures

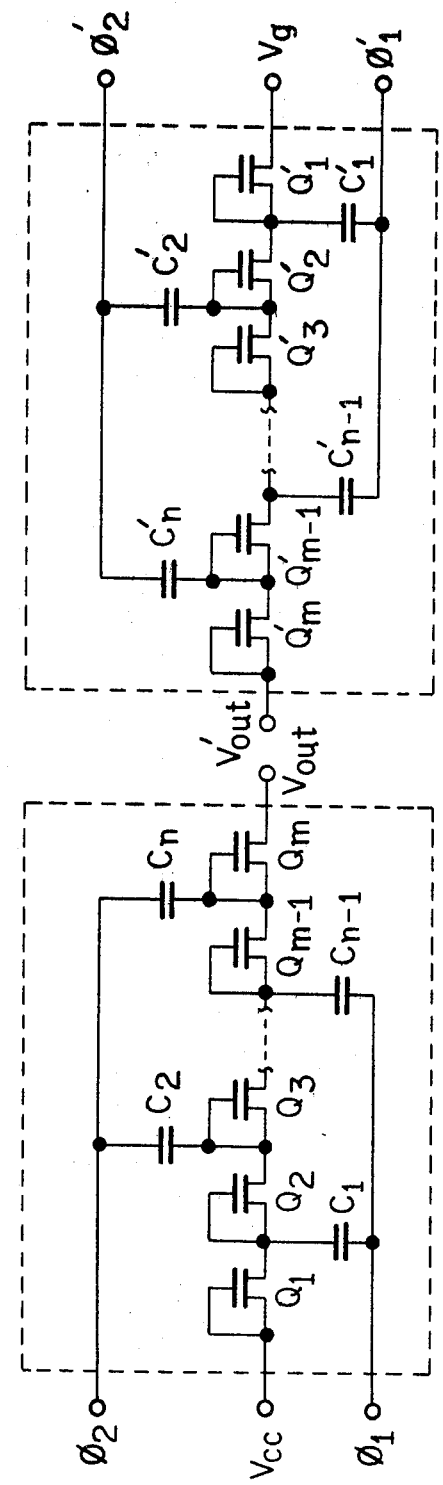
FIG.1A PRIOR ART
FIG.1B PRIOR ART
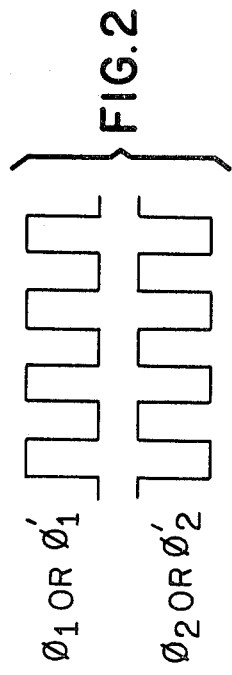
FIG.2 PRIOR ART

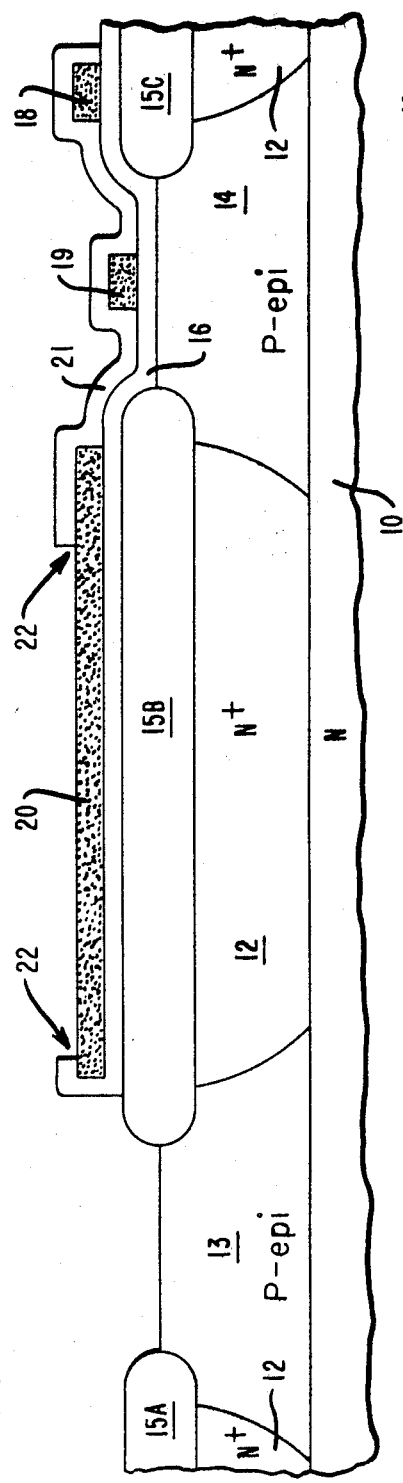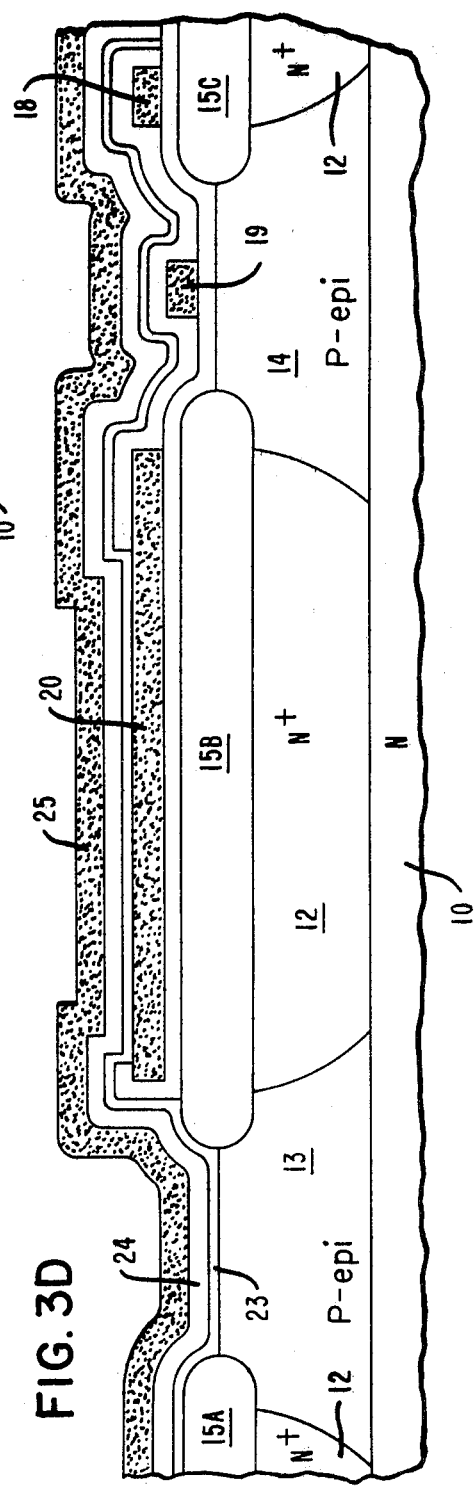
FIG. 3C
FIG. 3D

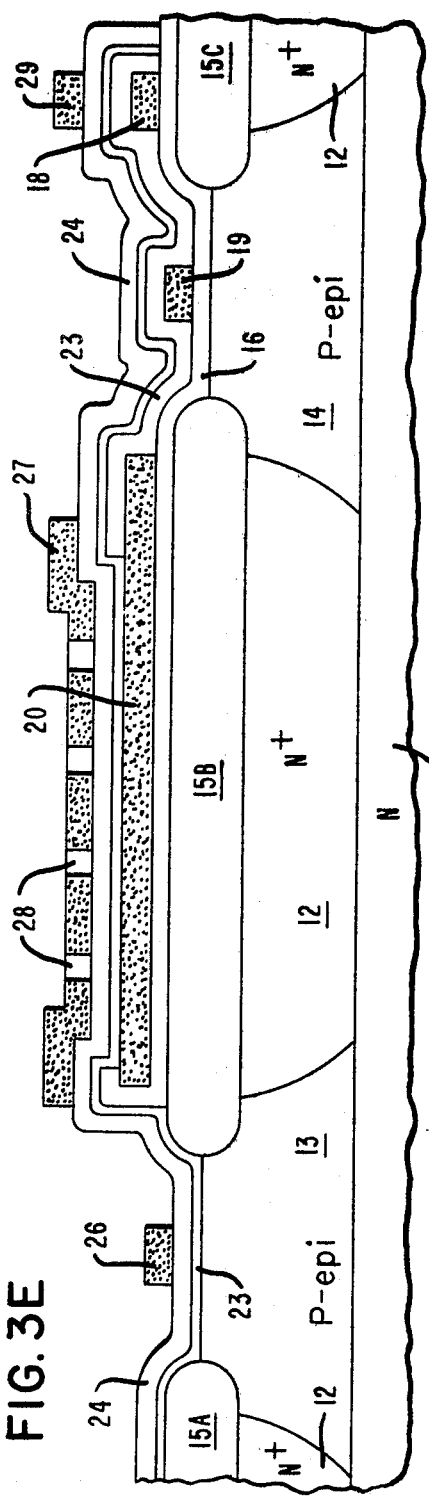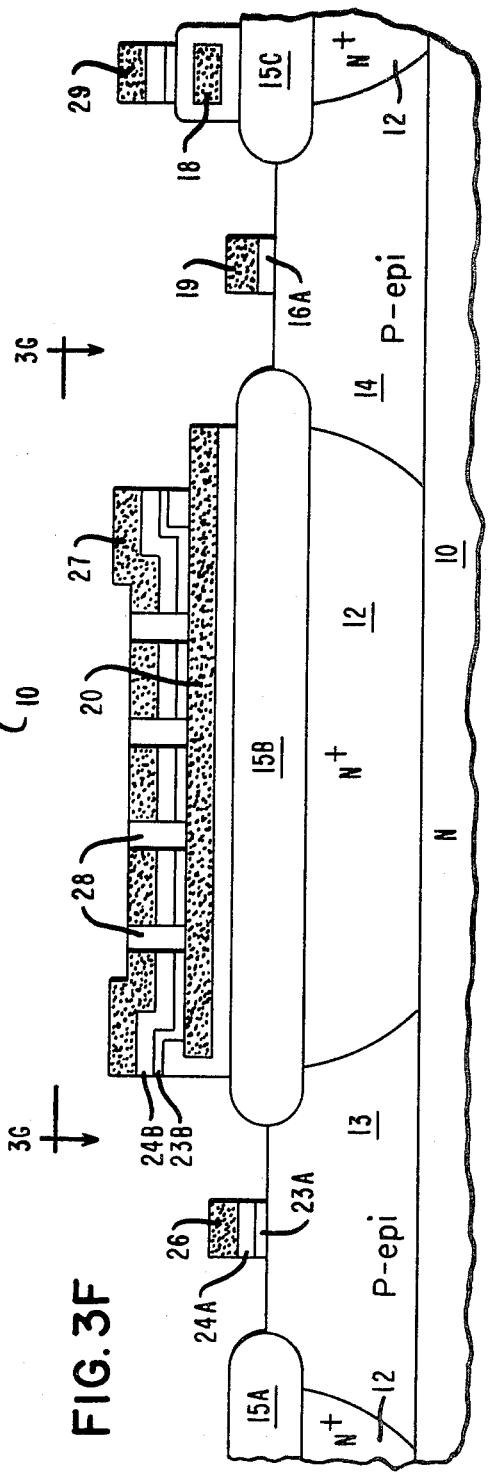

METHOD OF FABRICATING AN INTEGRATED CIRCUIT VOLTAGE MULTIPLIER CONTAINING A PARALLEL PLATE CAPACITOR

BACKGROUND OF THE INVENTION

This invention relates to a method of making high capacitance per unit area charge storage capacitors and rectifiers for a voltage multiplier, and more particularly, to polysilicon-insulator-polysilicon capacitors and polysilicon-insulator-semiconductor enhancement mode field effect transistors that are compatible with conventional monolithic double level polysilicon integrated circuit fabrication.

MNOS and its silicon gate counterpart SNOS (hereafter MNOS includes SNOS and vice versa) technology is now well-established for constructing nonvolatile memory integrated circuits. Because of its excellent memory operational characteristics MNOS technology is experiencing increasing application to various types of semiconductor integrated circuit memory arrays such as E²PROMs and NVRAMs. One disadvantage of the technology, which has somewhat restricted its application, is the requirement of high (of the order of 25 volts or more) program (i.e. write and erase) voltages necessitating dual polarity (+ and −) external power supplies.

The goal of the microelectronics industry is to use a single 5 volt external power supply and generate, on-chip, the high erase and write voltages thereby eliminating the need for multiple external power supplies and making the MNOS devices econonically more viable. One method of on-chip high-voltage generation is by means of the voltage multiplier technique. One such prior art voltage multiplier scheme is shown in FIGS. 1A and 1B which represent circuits for generating a high positive voltage and low negative voltage, respectively.

Referring to FIG. 1A, $V_{CC}$ represents the input power supply voltage, typically 5 volts and $V_{OUT}$ is the voltage output of the positive voltage multiplier. $V_{OUT} >> V_{CC}$. $C_1, C_2 \ldots C_n$ are coupling capacitors and $Q_1, Q_2 \ldots Q_m$ are rectifying elements (or diodes). In this prior art voltage multiplier arrangement, the capacitors were typically depletion mode MOS or MNOS transistors and the rectifying elements were diode-connected enhancement mode MOS transistors.

Referring to FIG. 1B, $V_g$ here represents the ground connection and $V'_{OUT}$ is the voltage output of the negative voltage multiplier. $V'_{OUT} << V_g$. As in FIG. 1A, $C'_1, C'_2 \ldots C'_n$ and $Q'_1, Q'_2 \ldots Q'_m$ represent coupling capacitors and diodes, respectively. The significant difference between the prior art schemes shown in FIGS. 1A and 1B is that the depletion mode transistors $C'_1, C'_2 \ldots C'_n$ shown in FIG. 1B are connected in a direction reverse to that of devices $C_1, C_2 \ldots C_n$ in order to generate the low-negative voltages at each successive node of the diode chain and to ensure that these negative voltages do not turn off transistors $C'_1$, $C'_2$ etc.

$\phi_1$ and $\phi_2$ shown in FIG. 1A and $\phi_1'$ and $\phi_2'$ shown in FIG. 1B designate two clock pulses, of the type shown in FIG. 2, having a fixed amplitude and in antiphase with each other. These pulses are applied to the successive nodes of the diode-chain via the coupling capacitors. The amplitude of these clock pulses is typically about 5 volts.

Using the voltage multiplier circuit shown in FIG. 1A, in the publication entitled "On-Chip High-Voltage Generation in MNOS Integrated Circuits Using An Improved Voltage Multiplier Technique" by J. F. Dickson and published in IEEE Journal of Solid State Circuits, Vol. SC-11, No. 3, June 1976, pp. 374–378, it was demonstrated that it is possible to generate, on-chip, high-voltages of up to +40 volts to enable operation of MNOS integrated circuits. In this publication, the coupling capacitors appear to be depletion mode transistors which were implemented using the nitride dielectric available in the MNOS process and the diodes were MOS transistors.

A drawback of positive and negative voltage multiplier circuits which use depletion mode transistors as coupling capacitors is that they cannot be conveniently used for generating high positive and low negative voltages at the same (output) node. This ability is essential for an on-chip voltage multiplier since devices on an I.C. chip such as NV RAMs invariably require that the same node of the voltage multiplier go both positive and negative. In other words, in order to generate the required voltages, on-chip, the output nodes $V_{OUT}$ and $V'_{OUT}$ of FIGS. 1A and 1B, respectively, need to be connected and this common node be used for programming the devices on the chip. However, when the outputs $V_{OUT}$ and $V'_{OUT}$ of the prior art voltage multiplier circuits which used depletion mode transistors for capacitors are connected together, voltage multiplication is severely hampered, if not, destroyed, since such an arrangement will turn off many of these depletion mode devices. For example, if the (negative) output $V'_{OUT}$ of FIG. 1B is connected to the (positive) output $V_{OUT}$ of FIG. 1A then this negative voltage, when applied via the diode $Q_m$ to the gate of the depletion transistor $C_n$, will turn off $C_n$. Likewise, when this negative gate voltage of $C_n$ is applied, via diode $Q_{m-1}$ to the gate of the transistor $C_{n-1}$, it will turn off $C_{n-1}$ and so on. Thus, a number of depletion mode devices $C_n, C_{n-1} \ldots$ will turn off rendering the positive voltage multiplier non-functional. A similar hampering of the negative voltage multiplier (FIG. 1B) operation will occur if (the positive) node $V_{OUT}$ is connected to (the negative) node $V'_{OUT}$.

One way of overcoming the above voltage multiplier problem is by not connecting together $V_{OUT}$ and $V'_{OUT}$ and discharging these output nodes separately. However, this necessitates two separate discharging circuits.

Another way of overcoming the above voltage multiplier operation problems when the output nodes of the positive and negative multiplier are connected together, is by eliminating the depletion mode devices altogether and using in their place permanent capacitors. Since operation of permanent capacitors is not dependent upon the polarity of the voltage applied across their plates, it is possible to connect together the output nodes of the positive and negative multipliers without affecting the performance of either. However, fabrication of such permanent capacitors, on-chip, require additional cumbersome processing steps in the prior art single level silicon or metal MNOS process by virtue of limitations of the MNOS process. The cost of these additional steps may outweigh the benefit of building, on-chip, dual polarity voltage multipliers in these earlier MNOS processes.

It is an object of this invention to form permanent capacitors, for use in on-chip dual polarity voltage multiplier construction, using the conventional double level silicon SNOS process for fabricating passive devices and active memory and non-memory devices without additional process or mask steps.

It is another object of this invention to form parallel high conductivity polysilicon plate capacitors by using a single doping step to simultaneously dope both the upper and lower polysilicon plates.

It is another object of this invention to form high capacitance per unit area polysilicon-insulator-polysilicon capacitors simultaneously with silicon gate MOS enhancement mode transistors for use as elements of an on-chip positive and negative voltage multiplier.

These and other objects of the invention will be apparent from the following description.

SUMMARY OF THE INVENTION

Disclosed is a process, which is compatible with the conventional two layer polysilicon monolithic integrated circuit fabrication and provides, as an integral part thereof, silicon gate enhancement mode transistors and polysilicon-insulator-polysilicon parallel plate capacitors for a dual polarity voltage multiplier. Preferably, after the step of doping the first polysilicon (poly I) layer to a low level of conductivity suitable for high ohmic value resistors, the poly I layer is patterned into a resistor, a gate for non-memory enhancement mode transistor (diode) and the lower plate of the capacitor. The capacitor plate thus formed is then isolated by forming isolation oxide around the periphery of the plate in the same isolation step used for isolating the non-memory device gate and the resistor. Then, the capacitor insulator is formed in the same step(s) used for forming the memory device's gate insulator (typically, a thin oxide-nitride dual layer). Next, the upper plate of the capacitor is formed frowm the second polysilicon (poly II) layer which is conventionally used for forming therefrom gates for the memory devices, interconnecting lines, etc. Thereafter, both the upper and lower polysilicon capacitor plates are doped simultaneously by using the following unique process. The upper capacitor plate is patterned, in the same step used for defining this plate, to have therein a plurality of holes of a chosen size and separation. Thereafter, the capacitor insulator is etched, in the same step(s) used for defining the insulator layer into the capacitor insulator and gate insulator such that holes are formed in the capacitor insulator in correspondence with holes in the overlying poly II plate thus exposing portions of poly I plate in correspondence with holes in the overlying poly II plate and the capacitor insulator. Then, the entire poly II capacitor plate and the portions of the poly I plate exposed as indicated above are doped in the same conventional dopant deposition and diffusion steps used to dope the memory gates. Due to rapid lateral diffusion of dopant into the polysilicon, the dopant introduced into the poly I plate through the holes in the insulator and poly I layers will quickly distribute over the entire poly I plate, thereby doping it uniformly to a desired high conductivity level.

BRIEF DESCRIPTION OF THE DRAWINGS

FIGS. 1A and 1B are schematic diagrams of prior art voltage multiplier circuits. FIG. 1A represents a positive voltage multiplier and FIG. 1B represents a negative voltage multiplier.

FIG. 2 is a schematic representation of the voltage waveforms (clock pulses) applied to successive nodes of the voltage multiplier.

FIGS. 3A–3H are flow diagrams illustrating by sequential cross-sectional representation the process steps of the present invention culminating in the structure shown in FIG. 3. FIG. 3G, in particular, is a plan view of a portion of FIG. 3F.

DETAILED DESCRIPTION

Figure 3:
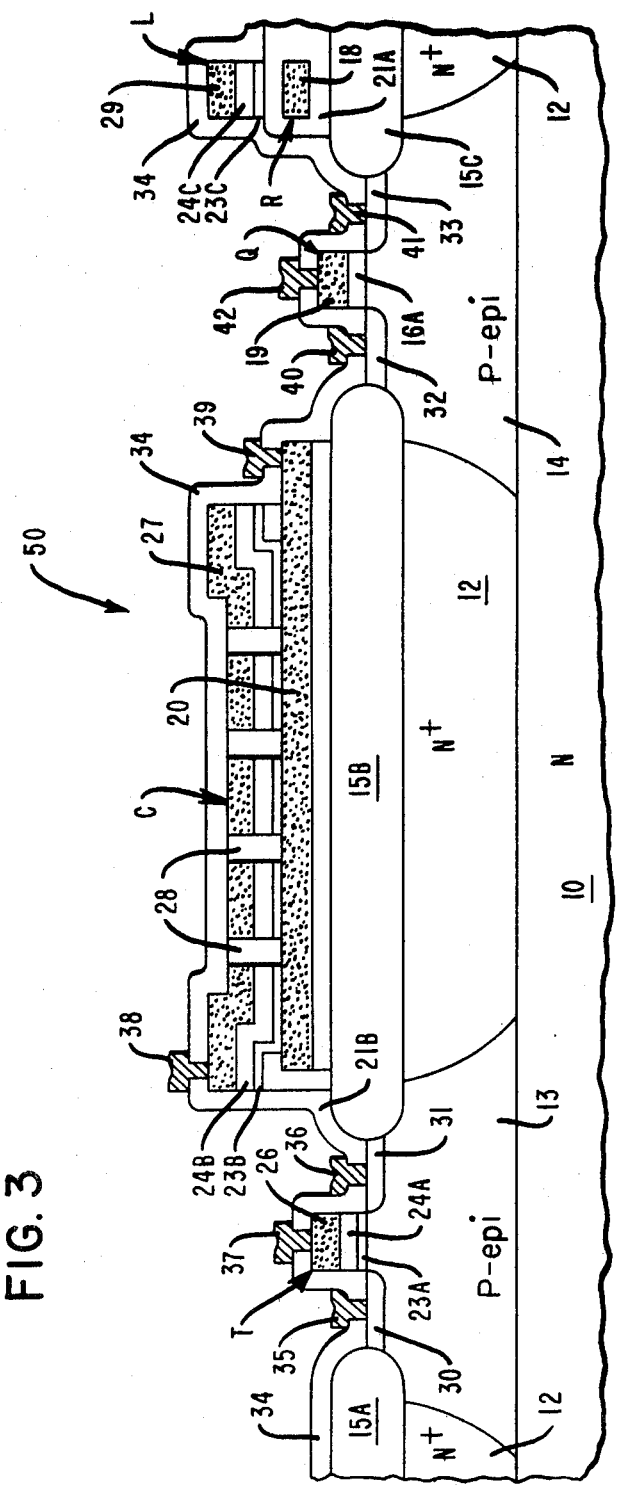
FIG. 3 is a partial sectional view of an integrated circuit chip embodying the principles of the present invention showing in integral relationship with a polysilicon gate memory device, a polysilicon resistor and interconnect, a parallel polysilicon plate capacitor and a polysilicon gate non-memory device for use as elements of an on-chip, voltage multiplier.

Referring now to the drawings and first to FIG. 3 thereof, there is shown in this Figure a partial sectional view of an integrated circuit chip 50 embodying the principles of the present invention. The portion of the chip 50 includes an n-channel silicon gate memory transistor T, a polysilicon parallel plate capacitor C, an n-channel non-memory silicon gate transistor Q, a polysilicon resistor R and a polysilicon interconnect L. These various active and passive devices are formed on the upper surface of an n-type silicon substrate 10 that includes p-wells 13 and 14 which are isolated from each other by means of n-type diffusion regions 12.

Memory transistor T comprises a conductive polysilicon gate 26 and highly doped $n^+$ regions 30 and 31, which, respectively, serve as source and drain regions for the device. A thin silicon dioxide (memory oxide) layer 23A and silicon nitride layer 24A insulate the polysilicon gate 26 from the underlying substrate 13. Transistor T further includes metal contacts 35, 36 and 37, respectively, with source 30, drain 31 and gate 26.

The capacitor C is disposed atop a thick field isolation oxide region 15B and comprises a lower polysilicon plate 20 and an upper polysilicon plate 27 having therein a plurality of holes 28. A dual silicon oxide layer 23B (of approximately the same thickness as memory oxide 23A) and nitride layer 24B (of the same thickness as gate insulator 24A) having holes therein in registry with the holes 28 in plate 27 insulate plates 20 and 27 from each other. The capacitor C further includes metal contacts 38 and 39 making electrical contact with plates 27 and 20, respectively.

The non-memory transistor Q comprises a conductive polysilicon gate 19 and highly doped $n^+$ source and drain regions 32 and 33, respectively. A relatively thick silicon dioxide (gate oxide) 16A insulates the polysilicon gate 19 from the underlying substrate 14. Transistor Q further includes metal contacts 40, 41 and 42 making electrical contact, respectively, with source 32, drain 33 and gate 19 of this device.

The polysilicon resistor R is formed on the field oxide 15C and includes a lightly doped polysilicon strip 18 which is electrically isolated from other devices on the chip by isolation oxide 21A. The thickness of polysilicon 18 is the same as that of the capacitor plate 20 and has sheet resistance of about 10 megohms per square.

Interconnect L located atop the resistor R and insulated therefrom by not only the isolation oxide 21A, but also the oxide 23C and nitride 24C (which is of the same thickness as layers 24A and 24B), is a polysilicon strip 29 having the same thickness and conductivity as gate 26 of transistor T and plate 27 of capacitor C.

Structure 50 further includes a thick oxide layer 34 which electrically isolates the various devices T, C, Q, L, etc. from each other.

The capacitor C and the non-memory silicon gate MOS transistor (diode) Q may be connected as indicated in FIGS. 1A and 1B for generating, on-chip, high positive and low negative voltages.

Reference is now made to FIGS. 3A–3H wherein the successive steps of the fabrication process of the present invention is illustrated in detail.

While the following description is primarily directed to the fabrication of an integrated circuit chip comprised of an n-channel silicon gate memory transistor T, a parallel polysilicon plate capacitor C, an n-channel silicon gate non-memory enhancement mode transistor Q, a polysilicon resistor R, and polysilicon interconnect L, this description is exemplary of the fabrication of a class of devices which embody principles of the present invention. In addition, it should be noted that the thickness and other dimensions shown herein are selected from clarity of illustration and not to be interpreted in a limited sense.

Figure 3A:
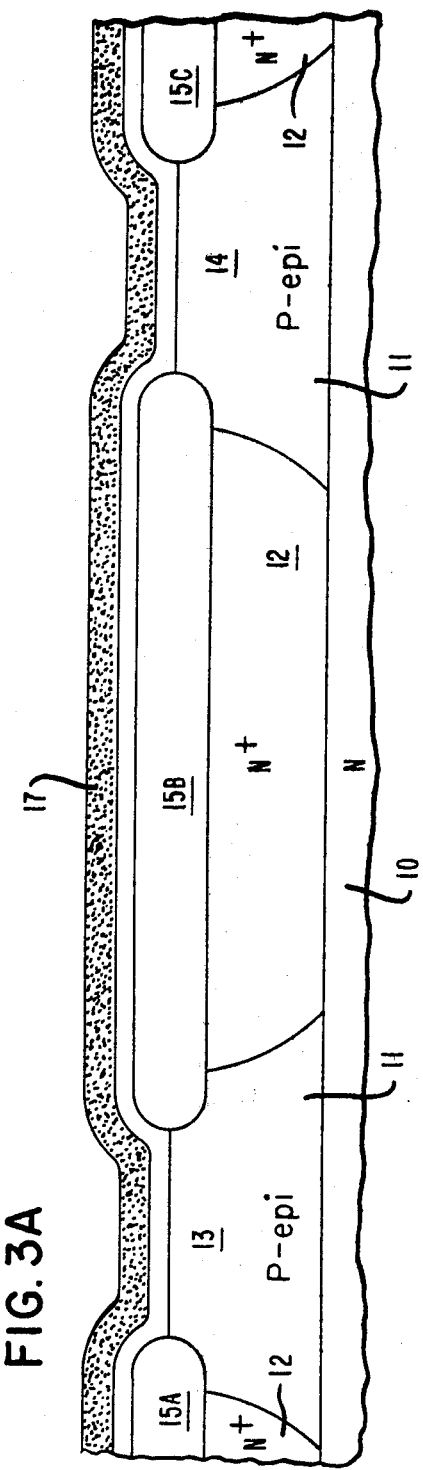

Referring now to FIG. 3A, the fabrication process of the present invention is initiated starting from an n-type single crystal silicon substrate 10 upon which a p-type epitaxial layer 11 has been grown. A deep N+ diffusion 12 (typically phosphorus) is made to isolate portions 13 and 14 of the epitaxial layer 11. Within each of these isolated portions 13 and 14 (also referred to herein as p-wells) will be located various memory and non-memory devices. For example, in the embodiment under consideration, the silicon gate MNOS memory transistor T will be located in the isolated portion 13 and the silicon gate MOS enhancement mode non-memory transistor Q will be located in the isolated portion 14. Isolation of the MOS diodes from other parts of the circuit in this manner is crucial for generating the negative voltages by the voltage multiplier which will be constructed using these MOS diodes. Over the epitaxial layer 11 as separated by the n+ diffusion 12 is then formed in a conventional manner thick (5,000–20,000 Angstroms) silicon dioxide field isolation regions 15A, 15B, 15C. The coupling capacitor C will be located atop the field oxide 15B and the resistive element R will be located atop the field oxide region 15C.

The succeeding step in the process, which is also illustrated with reference to FIG. 3A, is growth of a relatively thin gate oxide layer 16 of thickness about 800 Angstroms over the wafer. Thereafter, using conventional photolithography and implantation techniques the surface portion of the isolated region 14 is subjected to an enhancement implant through the gate oxide 16 using, for example, boron ions of energy 40 keV and dose $4.3 \times 10^{11}$ per square cm to obtain the desired (positive) threshold of the enhancement mode transistor Q that will be formed thereover. Next, a first layer 17 of polysilicon (poly I) is deposited over the entire structure to a thickness of about 5,000 Angstroms. A preferred technique for forming poly I layer 17 is by low pressure chemical vapor deposition (LPCVD) using silane at a temperature of about 625° C. and pressure of 100 millitorr. LPCVD of polysilicon is preferred since this insures uniformity in thickness and reproducibility which are vital in a high volume production situation. Since the integrated circuit under consideration is contemplated to contain resistive elements, the poly I layer 17 is subjected to a light doping for the subsequent formation of poly I resistor elements. A suitable implantation involves phosphorus ions having an energy of approximately 110 keV and dose about $1.6 \times 10^{14}$ per square cm. The resulting sheet resistance of poly I will be about 10 megohms per square.

The process steps discussed heretofore are conventional and are described, for example, in U.S. Ser. No. 352,734 by V. K. Dham, E. H. Honningford, J. K. Stewart, R. F. Pfeifer, and M. L. Trudel and assigned to NCR Corporation, the present assignee. The distinctive features of the present process appear in the steps that follow.

Figure 3B:
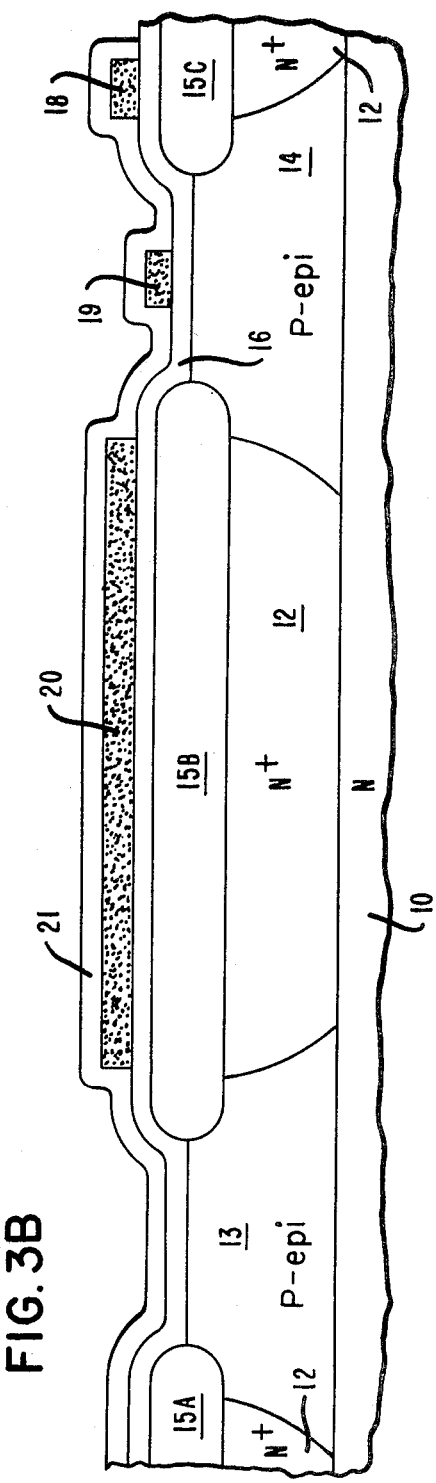

In progressing towards the structure shown in FIG. 3B, the resistively doped poly I layer 17 is patterned using conventional photolithographic and etching techniques into poly I resistor 18, gate electrode 19 for the enhancement mode transistor Q to be formed in the surface region of isolated portion 14 and the lower plate 20 of the coupling capacitor C to be formed atop the central field isolation oxide 15B.

Next, referring further to FIG. 3B, a silicon dioxide layer 21 is formed over the entire structure by thermal oxidation at a temperature of about 900° C., to a thickness in the range 2,000–4,000 Angstroms. The oxide layer 21 will serve to isolate the periphery of the poly I capacitor plate 20 from the upper poly II plate that will be subsequently formed thereover and also to isolate the poly I resistor 18 from the poly II interconnect L that will be subsequently formed thereover, and as such will be referred to hereinafter as isolation oxide. During this oxidation step, a small percentage of the poly I segments 18, 19 and 20 will be consumed.

After forming isolation oxide 21, the next step in the SNOS process, as shown in FIG. 3C, is removal of the isolation oxide 21 (and the underlying gate oxide 16) in the surface portion of the p-well 13 to form the memory dielectric over said exposed portion of the p-well. The present process takes advantage of this process step by additionally forming a wide window 22 in the isolation oxide to expose a surface portion of the poly I capacitor plate 20 as shown in FIG. 3C.

Thereafter, referring to FIG. 3D, a very thin (approximately 20 Angstroms thickness) layer 23 of silicon dioxide and a relatively thick (approximately 250–500 Angstroms thickness) layer 24 of silicon nitride are formed over the entire wafer by using a conventional process such as the one described in copending continuation of U.S. Ser. No. 213,764 by Roberto-Romano Moran and assigned to the present assignee. In this process, the oxide layer 23 is formed by thermal oxidation of the wafer at a temperature of about 750° C. and the nitride 24 is formed immediately thereafter at the same temperature by LPCVD using gaseous dichlorosilane and ammonia in the ratio of 1:(3–4). This dual layer 23–24 constitutes the gate dielectric for the memory device T and the insulator for the capacitor C.

Although the oxide layer 23 is shown in FIG. 3D, for clarity of illustration, to have a uniform thickness over the entire structure, in reality this need not necessarily be the case. For example, if oxide 23 is formed by thermal oxidation as discussed in the previous paragraph, due to a lower oxidation rate of the isolation oxide 21 as compared with the remainder of the structure (i.e. the exposed poly I plate 20 and epitaxial region 13), the oxide layer 23 formed over the isolation oxide 21 will be thinner than that over the remainder of the structure.

An alternative to the dual oxide 23-nitride 24 layer memory device T gate dielectric and capacitor C insulator is a dual silicon oxide-silicon oxynitride layer disclosed in the copending U.S. application Ser. No. 407,374 filed in the name of the present inventor and assigned to the present assignee. In this embodiment the oxide 23 may be formed, for example, by thermal oxidation of the wafer and the oxynitride may be formed by LPCVD using reactant gases ammonia, dichlorosilane and nitrous oxide in the proportion, for example, of ammonia:dichlorosilane:nitrous oxide of about 3.5:1:2.

Yet another alternative to the dual dielectric layer 23-24 is a multiple layer of silicon oxide-silicon oxynitride-silicon nitride disclosed in copending U.S. Ser. No. 396,995.

Regardless of what dielectric (i.e. oxide-nitride dual layer or oxide-oxynitride dual layer or oxide-oxynitride-nitride multiple layer) is selected for the memory device T gate dielectric, the SNOS process step(s) of forming this gate dielectric is advantageously made use of in the present process to form also the capacitor C insulator without any additional mask or process steps.

On the other hand, if it is desired to form a capacitor C having an insulator layer different from the memory device T gate dielectric, the present process may be modified to accommodate the same. For example, instead of the dual oxide 23-nitride 24 layer a single nitride may be formed over the exposed portion of the capacitor plate 20. It is noted that a capacitor having a nitride insulator, for a given insulator thickness, will have a higher capacitance per unit area (C/A) than a capacitor having an oxide-nitride dual layer since C/A is proportional to the dielectric constant of the capacitor insulator and the dielectric constant of the nitride insulator is larger than that of the dual oxide-nitride insulator.

The next step in the present process is deposition of the second polysilicon layer 25 (poly II) over the entire wafer as shown in FIG. 3D. Poly II layer 25 is deposited in the same manner as poly I discussed hereinabove in connection with FIG. 3A.

In progressing toward the structure shown in FIG. 3E, the poly II layer 25 is patterned, by conventional photolithographic and planar plasma etching techniques, into the gate 26 for the memory device T, the upper plate 27 having therein a plurality of holes 28 for the coupling capacitor C and poly II interconnect 29. The holes 28 in the polysilicon plate 27 will be used for interoducing dopant into the underlying poly I plate 20 at a later doping step. Although the poly I plate 20 was initially doped to a low conductivity level suitable for resistors, further doping to a high conductivity level is essential to avoid the distributive effect of capacitance and resistance in the poly II plate 27-nitride 24-oxide 23-poly I plate 20 structure which gives rise to poor frequency response of the voltage multiplier that will be constructed using this structure as an element.

Referring to FIG. 3F, after patterning the polysilicon II layer 245 in the above manner, the etching step is continued to remove the nitride layer 24 everywhere except those regions of the substrate structure which ar masked by the poly II layer segments 26, 27 and 29. Note, during this nitride etching step, the portions of the nitride layer in correspondence with holes 28 are also etched away.

The wafer is then subjected to an oxide etch step using buffered hydrogen fluoride (HF) to remove the exposed portions of the memory oxide 23, isolation oxide layer 21 and the gate oxide 16. Since polycrystalline and monocrystalline silicon are not materially attacked by HF, the exposed polysilicon I and polysilicon II layer segments serve as etchant masks and etchant stops. At the conclusion of the oxide etch step, the wafer structure looks as shown in FIG. 3F where 23A and 24A, respectively, denote the oxide and nitride gate dielectric layers of the memory device T, 23B and 24B are, respectively, the oxide and nitride insulator layers of the capacitor C and 16A is the gate dielectric of the non-memory device Q.

Figure 3G:
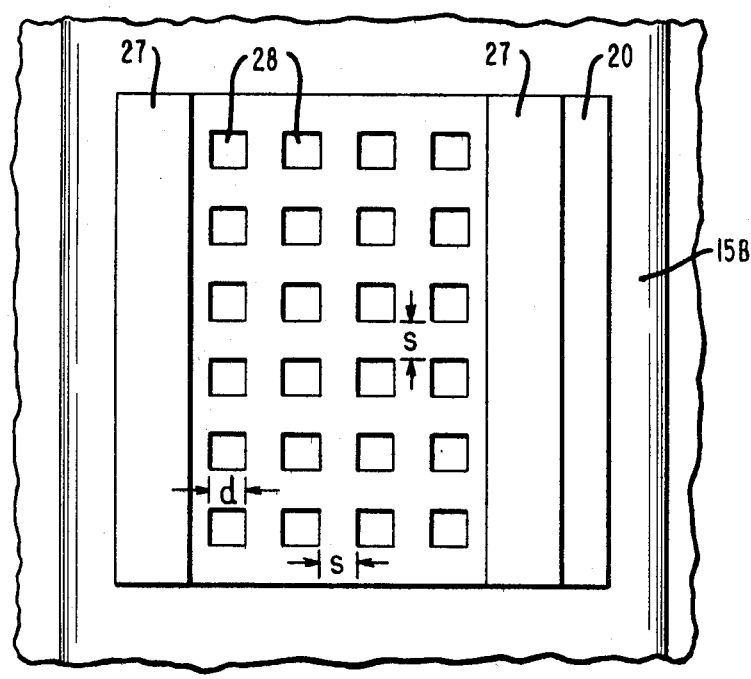

Referring now to FIG. 3G, which is a top plan view of the capacitor C, the plate 27 is shown for illustrative purposes, as having twenty four square holes 28. The actual number of holes 28 is determined by the dimension d of holes 28, their relative separation s and the area A of the capacitor plate. The dimension d and separation s are selected to provide doping of the entire poly I plate 20 by lateral diffusion of the dopant from the dopant-bearing material that will be introduced into plate 20, via holes 28, in the next process step. The extent of dopant lateral diffusion is, in turn, governed by the particular species of dopant selected, the temperature at which diffusion is accomplished and the time of diffusion. For example, if $d = 3$ microns, the dopant species is phosphorus, the diffusion temperature is 900° C. and the diffusion time is approximately 2 hours, the separation s between holes 28 should be 4.25 microns in order to obtain the necessary lateral dopant diffusion in the polysilicon plate 20 to render it highly and uniformly conductive.

Because of holes 28, there will be some loss in the capacitor C area. This loss of area, also referred to in terms of the area utilization factor U is given by $$U = (s^2 + 2sd)/(s+d)^2.$$

In the example discussed above, the loss of capacitor area due to holes 28 is about 17% or $U = 0.83$. However, the loss in capacitance due to area loss is more then compensated for by using a high dielectric constant capacitor insulator (nitride or oxide-nitride etc.) and by choosing a thin layer of this insulator.

Figure 3H:
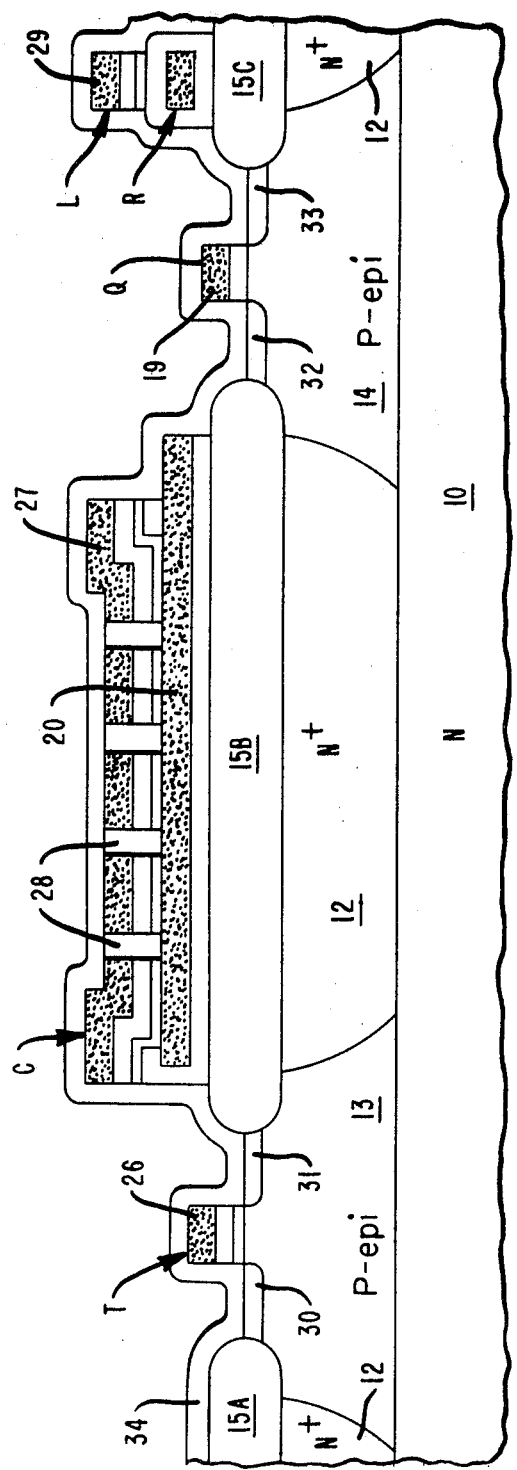

Thereafter, the wafer is subjected to a doping step to form sources and drains for the various transistors and to obtain low sheet resistance polysilicon gates, polysilicon capacitor plates, and polysilicon interconnect. One way of accomplishing this doping is by depositing a layer (not shown) of a phosphorus-bearing substance such as $POCl_3$ at a temperature of about 900° C. over the entire wafer including the surface areas of the poly I capacitor plate 20 which are in correspondence with the holes 28 formed through the overlying thin oxide 23B, nitride 24B and poly II plate 27. Then, the phosphorus dopant from the deposited $POCl_3$ layer is thermally diffused by subjecting the wafer for a period of time at a temperature of about 900°-1000° C. During this diffusion step, as shown in FIG. 3H, not only the sources and drains 30, 31 of the memory device T and 32 and 33 of the non-memory device Q are formed, but also the poly II gate 26 of the memory device T, the poly I gate 19 of device Q, the poly II interconnect 29 (also designated as L), and both the upper and lower poly II plates 27 and 20 of the capacitor C are doped to a high, uniform conductivity level (corresponding to a sheet resistance of, typically, about 30–50 ohms per square). The entire lower poly I capacitor plate 20 is uniformly doped due to the rapid lateral diffusion of phosphorus dopant that was introduced into the plate 20 via the holes 28 during the previous phosphorus deposition step.

Thus, in this process, high capacitance per unit area capacitors C are fomed along with non-memory enhancement mode MOS transistor Q, memory devices T, poly II interconnect L and poly I resistor R without use of additional masking or process steps than those empolyed in conventional SNOS process.

The capacitance of the capacitor C formed in the manner exemplified above is dictated to a certain extent by the thickness and type (i.e. dielectric constant) of memory gate dielectric selected for the device T, the area available on the chip for forming the capacitor plates, the loss of area of the poly II capacitor plate 27 due to holes 28 therein (which is called the area utilization factor) etc. When a dual oxide-nitride gate dielectric is used, the capacitance of the capacitor formed in the present process is given by:

$$C = \frac{\epsilon_n A U}{t_n + \frac{\epsilon_n}{\epsilon_{ox}} t_{ox}}$$

where $\epsilon_n$ is the dielectric constant of silicon nitride 24B, $\epsilon_{ox}$ is the dielectric constant of silicon oxide 23B, $t_n$ is the nitride 24B thickness, $t_{ox}$ is the oxide 23B thickness, A is the common area of capacitor plates 20 and 27 and U is the area utilization factor.

Typically, in a conventional low power, n-channel double silicon gate 32K density E$^2$PROM fabrication process, $t_{ox}=20$ Angstroms, $\epsilon_{ox}=3.8$, $t_n=380$ Angstroms, $\epsilon_n=5.6$. A poly I-oxide-nitride-poly II capacitor formed in this process and having a capacitor plate area $A=75\times75$ square microns and having 3 micron square holes with a relative separation s of 4.25 microns, giving rise to a utilization factor $U=0.83$, will have a capacitance of $5.65\times10^{-12}$ farads or a capacitance per unit area of $1\times10^{-7}$ farads per square cm.

Using the above high capacitance per unit area capacitors C and transistors (diodes) Q (FIG. 3G) as elements of the circuits shown in FIGS. 1A and 1B, it is possible to construct voltage multipliers which can generate both positive and negative voltages in the range of $\pm(15-25)$ volts and having a current capability in the range of 0-100 microamps. Such a voltage multiplier will be suitable for programming E$^2$PROMs and other devices.

After the doping step discussed hereinabove with reference to FIG. 3H, the normal IC fabrication process is then resumed to complete the fabrication of the monolithic chip. Referring to FIG. 3H, these steps include forming a thick (about 10,000 Angstroms thickness) isolation oxide 34 over the entire structure to dielectrically isolate each device, forming contact vias in the layer 34 and then forming metallization to provide ohmic contact to the various elements of devices T, C and Q, etc. The resulting final structure is as shown in FIG. 3I where 35, 36 and 37 denote the metal contacts for the source 30, drain 31 nd polysilicon gate 26, respectively, of device T; 38 and 39 are the metal contacts for the upper and lower polysilicon capacitor plates 27 and 20, respectively; and 40, 41 and 42 are the metal contacts for the source 32, drain 33 and polysilicon gate 19, respectively, of the device Q.

Although this process has been described in connection with a double-level polysilicon structure wherein the poly I is initially doped to a relatively low level, suitable for the specific purpose of forming therefrom polysilicon resistors, and the capacitor poly I lower plate 20, poly I gate 19 etc. are doped to a higher level subsequently, this process will be conducive for incorporation in any process where the plate 20 is not initially doped to the desired level.

The above described process may also be practiced by substituting in place of poly II layer 25 (FIG. 3D) other suitable materials such as a metal, polycide or a refractory metal silicide, e.g. tungsten silicide, tantalum silicide or molybdenum silicide. In this case since layer 25 is inherently highly conductive, it will not receive additional doping during the doping step discussed above in connection with FIG. 3H, but the poly I plate 20 and poly I gate 19 will be doped along with the forming of the various sources and drains.

Also, the above-described specific embodiment of the invention has been set forth for the purposes of illustration. It will be apparent to those skilled in the art that various modifications may be made without departing from the principles of this invention as pointed out and disclosed herein. For this reason, it is not intended that the invention should be limited other than by the scope of the appended claims.

I claim:

1. A process for forming a parallel conductive plate capacitor on a semiconductive substrate comprising:
    forming a first plate over said substrate;
    forming a dielectric layer over said first plate;
    forming a second plate having a plurality of windows over said dielectric;
    forming windows in said dielectric layer in a corresponding relationship with the windows in said second plate thereby forming a structure in which portions of the first plate which are in correspondence with said windows in the dielectric layer are exposed; and
    subjecting the structure to a doping step to dope the entire first plate.

2. The process as in claim 1 wherein said first plate is made of polycrystalline silicon and said second plate is made of either a metal or a refractory metal silicide or polycide.

3. The process as in claim 1 wherein said first and second plates are made of polycrystalline silicon and said process including doping said second plate simultaneously with doping of the first plate by depositing a dopant-bearing material over said second plate and the exposed portions of the first plate and thermally diffusing said dopant into said plates.

4. A process for forming a parallel conductive polysilicon plate capacitor on a semiconductive substrate comprising the steps in the sequence set forth:
    forming a first polysilicon plate over said substrate;
    forming a dielectric layer over said first polysilicon plate;
    forming a second polysilicon plate having a plurality of windows of a predetermined size and relative separation;
    forming windows in said dielectric layer in correspondence with the windows in said second plate thereby exposing portions of said first plate which are in registry with said windows in the dielectric layer;
    doping said first and second plates simultaneously by depositing a dopant-bearing material over said second plate and the exposed portions of the first plate and by controlled thermal diffusion laterally diffusing the dopant from said dopant-bearing material into said first and second plates;
    whereby the entire first plate is doped to a uniform doping level.

5. The process as recited in claims 3 or 4 wherein said dielectric is silicon nitride.

6. The process as recited in claim 4 wherein said controlled thermal diffusion includes adjusting the diffusion temperature and time to dope the entire first plate to a uniform conductivity level.

7. The process as in claim 6 wherein said windows are 3 microns square in size, said relative window separation is 4.25 microns, said dopant is phosphorus, the diffusion temperature is approximately 900° C. and the diffusion time is about 2 hours.

8. A process for forming a conductive polysilicon parallel plate capacitor and a polysilicon gate enhancement mode transistor for a voltage multiplier on a semiconductive substrate of a first conductivity type having an active region of a second conductivity type and a field isolation oxide region, said process comprising:
forming a gate oxide layer over said active region;
doping said active region to adjust the threshold voltage;
forming a first polysilicon layer over said gate oxide;
patterning said first polysilicon layer into a transistor gate electrode corresponding to said active region and a first plate of the capacitor corresponding to said field oxide region;
forming an isolation oxide layer over said structure;
selectively removing the isolation oxide over a central portion of the first polysilicon capacitor plate;
forming a dielectric layer over the structure;
forming a second polysilicon layer over said dielectric layer;
patterning said second polysilicon into the second capacitor plate having a plurality of holes therein;
patterning said dielectric layer into the capacitor insulator having a plurality of holes in correspondence with the holes in said second polysilicon capacitor plate;
removing said isolation oxide to expose said gate electrode and said active region; and
thermally diffusing or ion implanting active impurities of the first conductivity type to dope said first and second polysilicon capacitor plates and said gate electrode and form a source and a drain in self-aligned relationship with said gate electrode.

9. The process of claim 8 wherein said dielectric is silicon nitride.

10. A method of forming a monolithic integrated circuit comprising a polysilicon gate memory field-effect transistor, a polysilicon resistive element, a polysilicon gate non-memory depletion mode field-effect transistor and a parallel polysilicon plate capacitor, said non-memory transistor and capacitor being suitable for on-chip voltage multiplier connection, with a substrate of a first conductivity type having first and second active regions of a second conductivity type and a field isolation oxide region, said process comprising the steps of:
forming a gate oxide layer over said substrate;
forming over said gate oxide layer a doped first polysilicon layer suitable for forming resistive elements therefrom;
patterning the first polysilicon layer into a non-memory device gate electrode corresponding to said first active region, a resistive element and the first plate of the capacitor corresponding to said field isolation oxide region;
forming an isolation oxide layer over the resistive element, the first active region including said gate electrode and around the periphery of the first capacitor plate;
forming a dielectric over said structure;
forming a second polysilicon layer over said dielectric;
patterning said second polysilicon layer into a gate for the memory device corresponding to said second active region and a second capacitor plate having a plurality of holes therein;
patterning said dielectric into a gate dielectric for said memory device and the capacitor insulator having thereon holes in correspondence with the holes in said second polysilicon plate;
removing said isolation oxide to expose said non-memory device gate electrode and active region; and
thermally diffusing active impurities of the first conductivity type to dope said first and second capacitor plates, said gate electrodes and form sources and drains in self-aligned relationship with said gates.

11. The process of claim 10 further including patterning said second polysilicon layer in said second polysilicon patterning step into an interconnect corresponding to said resistive element and doping said interconnect during said thermal diffusion step.

12. The process as in claim 8, 10 or 11 wherein said dielectric is a dual layer of a relatively thin silicon dioxide and silicon nitride.

13. The process as in claim 8, 10 or 11 wherein said dielectric is a dual layer of a relatively thin silicon dioxide and silicon oxynitride.

14. The process as in claim 8, 10 or 11 wherein said dielectric is a triple layer of silicon dioxide, silicon oxynitride and silicon nitride, in that order.

* * * * *